United States Patent
Zhou

(10) Patent No.: US 8,710,893 B2
(45) Date of Patent: Apr. 29, 2014

(54) METHOD AND DEVICE FOR GENERATING LOW-JITTER CLOCK

(75) Inventor: Chang Zhou, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 42 days.

(21) Appl. No.: 13/510,930

(22) PCT Filed: Nov. 24, 2010

(86) PCT No.: PCT/CN2010/079092
§ 371 (c)(1),
(2), (4) Date: May 18, 2012

(87) PCT Pub. No.: WO2011/063749
PCT Pub. Date: Jun. 3, 2011

(65) Prior Publication Data
US 2012/0229180 A1    Sep. 13, 2012

(30) Foreign Application Priority Data

Nov. 25, 2009  (CN) .......................... 2009 1 0224251

(51) Int. Cl.
*G06F 1/04* (2006.01)
*H03K 3/00* (2006.01)

(52) U.S. Cl.
CPC ...................................... *G06F 1/04* (2013.01)
USPC ......................................... 327/298; 327/291

(58) Field of Classification Search
USPC ................................................. 327/291, 298
See application file for complete search history.

(56) References Cited

U.S. PATENT DOCUMENTS

| 5,410,263 A * | 4/1995 | Waizman ...................... 327/141 |
| 6,396,889 B1 * | 5/2002 | Sunter et al. .................. 375/376 |
| 7,339,984 B1 * | 3/2008 | Daou ............................ 375/225 |
| 2003/0201927 A1 | 10/2003 | Watanabe et al. |
| 2008/0191762 A1 | 8/2008 | Hein et al. |

FOREIGN PATENT DOCUMENTS

| CN | 1484380 A | 3/2004 |
| CN | 1885720 A | 12/2006 |
| CN | 101719765 A | 6/2010 |
| EP | 1748562 A1 | 1/2007 |

OTHER PUBLICATIONS

International Search Report for PCT/CN2010/079092 dated Feb. 11, 2011.

* cited by examiner

*Primary Examiner* — Ryan Jager
(74) *Attorney, Agent, or Firm* — Ling Wu; Stephen Yang; Ling and Yang Intellectual Property

(57) ABSTRACT

The present invention discloses a method for generating a low jitter clock, including: inserting a time delay in each low-speed clock period to finely adjust a high-speed clock, and then performing frequency division operation on the adjusted high-speed clock to obtain the required low-speed clock. The present invention also discloses an apparatus for generating the low jitter clock at the same time. By using the method and the apparatus, the jitter of the low-speed clock can be decreased. The implementation method is simple and convenient and the device cost is saved.

10 Claims, 3 Drawing Sheets

METHOD AND DEVICE FOR GENERATING LOW-JITTER CLOCK

TECHNICAL FIELD

The present invention relates to a recovery technology of a low-speed clock in the communication field, and in particular, to a method and apparatus for generating a low jitter clock.

BACKGROUND OF THE RELATED ART

At present, in the recovery procedure of the branch clock of the synchronous digital hierarchy (SDH) optical terminal, or in the application of the end-to-end pseudowire emulation, it needs to recover the clock of E1 or T1, and the conventional method is: performing the frequency division operation on the high-speed clock to obtain the low-speed clock, however, in the procedure of the practical application, the high-speed clock cannot always be the integral multiple of the low-speed clock, so it needs to finely adjust the rate of the low-speed clock constantly. Since the low-speed clock is obtained from the frequency division of the high-speed clock, the difference is possible at least one high-speed clock period between the adjacent periods of the low-speed clock; that is to say, the jitter between the adjacent periods of the low-speed clock is at least one high-speed clock period. But the jitter of the low-speed clock is not what we need, that is, the smaller the jitter is, the better it is.

In the related art, the method for reducing the jitter is as follows: 1), improving the frequency of the high-speed clock, then the improvement of the frequency of the high-speed clock reducing the high-speed clock period correspondingly, therefore reducing the jitter of the low-speed clock correspondingly; 2), adding one analog phase lock loop behind the low-speed clock obtained by recovery, which can be used for eliminating the jitter.

Although the two above-mentioned methods achieve the objective of reducing the jitter, there are their own defects: in the method 1), due to the limitation of the current device function, it is impossible to infinitely add the frequency of the high-speed clock, that is to say, it is difficult to greatly increase the frequency of the high-speed clock, and improving the frequency of the high-speed clock will increase the power consumption greatly, and also increase the cost of the device; in the method 2), the analog phase lock loop is added behind the low-speed clock obtained by recovery, which increases the cost of device as well.

SUMMARY OF THE INVENTION

In view of this, the main objective of the present invention is to provide a method and apparatus for generating a low jitter clock, which can decreases the jitter of the low-speed clock. And the implementation method is simple and convenient and the device cost is saved.

In order to achieve the above-mentioned objective, the technical scheme of the present invention is realized as follows:

the present invention provides a method for generating a low jitter clock, comprising:

inserting a time delay in each low-speed clock period to finely adjust a high-speed clock, and then performing frequency division operation on the adjusted high-speed clock to obtain a required low-speed clock.

Wherein, the step of inserting a time delay in each low-speed clock period to finely adjust a high-speed clock, and then performing frequency division operation on the adjusted high-speed clock to obtain a required low-speed clock is specifically:

selecting time delay $\Delta t$ corresponding to performing time delay operation, and according to actual requirement and the time delay $\Delta t$, calculating a time interval T between two adjacent insertions of the time delay $\Delta t$ in the high-speed clock, total number N of inserting the time delay $\Delta t$ and multiple of frequency division; and during a period of time corresponding to each low-speed clock period, inserting one time delay $\Delta t$ in a single period of the high-speed clock at intervals of one time interval T until N time delay $\Delta t$s are inserted, and according to the multiple of frequency division obtained from calculation, performing the frequency division on the high-speed clock which the time delay operation has been performed on, to obtain the required low-speed clock.

Wherein, the actual requirement is: frequency of the high-speed clock on which the frequency division will be performed and frequency of the required low-speed clock.

Wherein, the time delay $\Delta t$ is a positive value or a negative value; and correspondingly, said inserting one time delay $\Delta t$ in the single period of the high-speed clock is: adding or deducting one absolute value of time delay $\Delta t$ in the single period of the high-speed clock.

Wherein, the absolute value of the time delay $\Delta t$ is less than a value of one high-speed clock period.

In the above-mentioned scheme, said adding or deducting one absolute value of time delay $\Delta t$ in the single period of the high-speed clock is based on:

if the frequency of the low-speed clock required to be obtained is less than the clock frequency obtained after an integer frequency division is performed on the high-speed clock, adding one absolute value of time delay $\Delta t$ in the single period of the high-speed clock; if the frequency of the low-speed clock required to be obtained is greater than the clock frequency obtained after the integer frequency division is performed on the high-speed clock, deducting one absolute value of time delay $\Delta t$ in the single period of the high-speed clock.

The present invention further provides an apparatus for generating a low jitter clock, comprising a clock adjustment module, configured to insert a time delay in each low-speed clock period to finely adjust a high-speed clock, and perform frequency division operation on the adjusted high-speed clock to obtain a required low-speed clock.

Wherein, the clock adjustment module further comprises a delay module, a frequency division module and a calculation module;

the calculation module is configured to, according to actual requirement and the time delay $\Delta t$ selected by the delay module, calculate a time interval T between two adjacent insertions of the time delay $\Delta t$ in the high-speed clock and total number N of the time delay $\Delta t$s required to be inserted, and send a calculation result to the delay module;

and the calculation module is further configured to calculate multiple of frequency division according to the actual requirement and send a calculation result to the frequency division module;

the delay module is configured to, during practical application, provide time delay $\Delta t$ corresponding to performing time delay operation for a user to select, and notify a selection result of the user to the calculation module; after receiving the calculation result sent by the calculation module, during a period of time corresponding to each low-speed clock period, insert one time delay $\Delta t$ in a single period of the high-speed clock at intervals of one time interval T until N time delay Δts are inserted, and transmit the high-speed clock which the time delay operation has been performed on to the frequency division module; and the frequency division module is configured to, according to the multiple of frequency division obtained from calculation of the calculation module, perform the frequency division operation on the high-speed clock on which the time delay operation has been performed sent by the delay module to obtain the required low-speed clock.

Wherein, an absolute value of the time delay Δt is less than a value of one high-speed clock period.

In the method and apparatus for generating a low jitter clock provided by the present invention, the time delay Δt corresponding to performing the time delay operation is selected, and according to actual requirement and the size of the time delay Δt, a time interval T between two adjacent insertions of the time delay Δt in the high-speed clock and the total number N of the time delay Δt required to be inserted are calculated; during the period of time corresponding to each low-speed clock period, one time delay Δt is inserted in a single period of the high-speed clock at intervals of one time interval T until N time delay Δts are inserted; and perform the frequency division on the high-speed clock which the time delay operation has been performed on to obtain the required low-speed clock. The time delay operation performed on the high-speed clock in the present invention can make the jitter in the low-speed clock period generated by the frequency division reduce to 1/N of jitter in the low-speed clock period in the related art, moreover, the smaller the absolute value of the selected Δt is, the greater the corresponding N value is, and the generated jitter is smaller; in addition, the present invention only needs to increase a delay module and a corresponding calculation module on the basis of the existing device. The implementation method is simple and convenient and it can save the device cost compared with increasing the analog phase lock loop.

PREFERRED EMBODIMENTS OF THE PRESENT INVENTION

The basic idea of the present invention is: inserting a time delay in each low-speed clock period to finely adjust a high-speed clock, and then performing frequency division operation on the adjusted high-speed clock to obtain a required low-speed clock;

It is specifically that: the time delay Δt corresponding to performing time delay operation is selected, and according to actual requirement and the time delay Δt, a time interval T between two adjacent insertions of the time delay Δt in the high-speed clock, total number N of inserting the time delay Δt and multiple of the frequency division are calculated; during the period of time corresponding to each low-speed clock period, one time delay Δt is inserted in a single period of the high-speed clock at intervals of one time interval T until N time delay Δts are inserted; according to the multiple of frequency division obtained from the calculation, the frequency division is performed on the high-speed clock which the time delay operation has been performed on to obtain the required low-speed clock.

In the present invention, the actual requirement is: the frequency of the high-speed clock on which the frequency division will be performed and the frequency of the required low-speed clock; and the inserted time delay Δt can be a positive value and also can be a negative value; correspondingly, the inserting one time delay Δt in the single period of the high-speed clock is: adding or deducting one absolute value of time delay Δt in the single period of the high-speed clock; the sum of N time delay Δts is greater than or equal to the period of the high-speed clock; the time delay Δt has a plurality of selectable values, and if the period of the high-speed clock is t, the absolute value of Δt can be t/4, t/2 or 3t/4 and so on, and the user can select arbitrarily.

The present invention is further described in detail combining with the accompanying drawings and the specific embodiment hereinafter.

Figure 1:
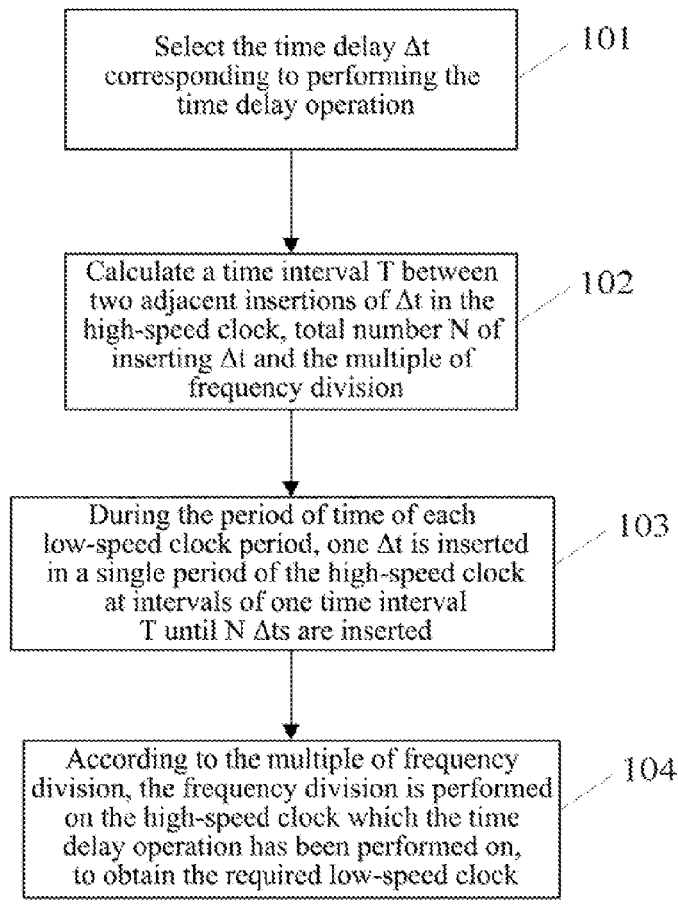
FIG. 1 is a flow chart of realizing a method for generating a low jitter clock according to the present invention.

FIG. 1 is a flow chart of realizing a method for generating a low jitter clock according to the present invention. As shown in FIG. 1, the steps of realizing the procedures are as follows:

in step 101: the time delay Δt corresponding to performing the time delay operation is selected;

herein, the absolute value of the time delay Δt can be selected as t/4, t/2, 3t/4 and so on, and the user can arbitrarily select the absolute value of the time delay Δt.

Wherein, the selectable value of the absolute value of the Δt should be less than one period value t of the high-speed clock, whose objective lies in making the jitter between two adjacent periods of the low-speed clock less than one period of the high-speed clock, because the jitter between two adjacent periods of the low-speed clock is at least one period of high-speed clock in the related art. It seems that the present invention can reduce the jitter of the low-speed clock on the basis of the related art.

In step 102: according to actual requirement and the time delay Δt, a time interval T between two adjacent insertions of the time delay Δt in the high-speed clock, total number N of inserting the time delay Δt and multiple of the frequency division are calculated;

it is specifically that: according to the frequency of the high-speed clock, the frequency of the low-speed clock required to be obtained after the frequency division is performed and the time delay Δt, the time interval T between two adjacent insertions of the time delay Δt in the high-speed clock is calculated, and the total number N of time delay Δt required to be inserted and the multiple of the frequency division performed on the high-speed clock are calculated.

Herein, the specific method of the calculation is that: according to the period of the high-speed clock t and the time delay Δt selected in step 101, the total number N of the time delay Δt required to be inserted is calculated to be t/Δt; the T has a direct correlation with the time interval of inserting one high-speed clock pulse in the single period of the high-speed clock in the current processing method, and the calculation method is that: if one high-speed clock pulse is inserted in the single period of the high-speed clock at intervals of ΔT in the current processing method, then the T of the present invention is ΔT/N; and the calculation method of the multiple of the frequency division is: the integer part of the ratio of the high-speed clock frequency to the low-speed clock frequency.

In step 103: during the period of time corresponding to each low-speed clock period, one time delay Δt is inserted in a single period of the high-speed clock at intervals of one time interval T until N time delay Δts are inserted;

it is specifically that: during the period of time corresponding to each low-speed clock period, one absolute value of time delay Δt is added or deducted in the single period of the high-speed clock at intervals of one time interval T obtained from the calculation; if N−1 absolute values of Δt have already been added or deducted, and when adding or deducting the $N^{th}$ absolute value of the time delay Δt, one high-speed clock pulse is added or deducted at the same time.

In the present invention, said adding or deducting one absolute value of time delay Δt in the single period of the high-speed clock is based on: if the frequency of the low-speed clock required to be obtained is less than the clock frequency obtained after the integer frequency division is performed on the high-speed clock, adding one absolute value of time delay Δt in the single period of the high-speed clock; and if the frequency of the low-speed clock required to be obtained is greater than the clock frequency obtained after the integer frequency division is performed on the high-speed clock, deducting one absolute value of time delay Δt in the single period of the high-speed clock.

Herein, the objective of adding or deducting one high-speed clock pulse at the same time when adding or deducting the $N^{th}$ absolute value of the time delay Δt is that: since the clock phase exists, the waveform of the high-speed clock pulse to be delayed and adjusted in the single period of the low-speed clock is unable to be lengthened infinitely, and since the number N of the inserted time delay Δt in the single period of the low-speed clock is certain and N Δt is the single period of the low-speed clock, when adding or deducting the $N^{th}$ absolute value of the time delay Δt, the waveform will return to the initial location, that is, the zero delayed location, which is equivalent to deducting or adding N−1 absolute values of time delay Δt again, and one high-speed clock pulse is added or deducted on that basis, thus it is equivalent to adding or deducting one absolute value of time delay Δt altogether, which makes the jitter between the two adjacent periods of the low-speed clock reduce from NΔt to Δt.

Wherein, the initial location of inserting the time delay Δt in the single period of the high-speed clock is random, that is: the location of inserting the first time delay Δt is random, and the subsequent locations of inserting the time delay Δt are nT apart from that location, and n is 1, 2 . . . N.

In step 104: according to the multiple of frequency division obtained from the calculation, the frequency division is performed on the high-speed clock which the time delay operation has been performed on to obtain the required low-speed clock.

Herein, the specific implementation method of the frequency division is the related art, which will not be described in detail.

Figure 2:
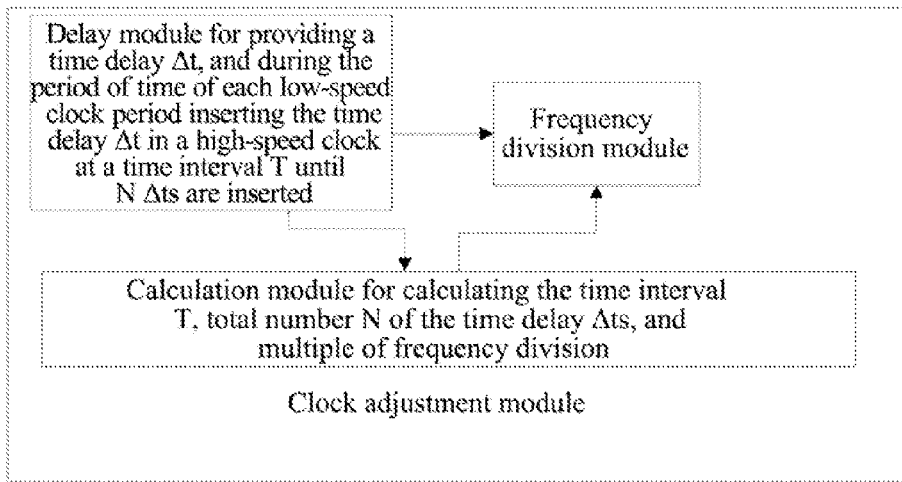
FIG. 2 is a structure schematic diagram of an apparatus for generating a low jitter clock according to the present invention.

FIG. 2 is a structure schematic diagram of an apparatus for generating a low jitter clock according to the present invention. As shown in FIG. 2, the apparatus includes a clock adjustment module, configured to insert a time delay in each low-speed clock period to finely adjust a high-speed clock, and perform frequency division operation on the adjusted high-speed clock to obtain a required low-speed clock.

The clock adjustment module includes a delay module, a frequency division module and a calculation module; wherein, the calculation module is configured to, according to actual requirement and the time delay Δt sent by the delay module, calculate a time interval T between two adjacent insertions of the time delay Δt in the high-speed clock and total number N of the time delay Δt required to be inserted, and send a calculation result to the delay module; and it is further configured to calculate multiple of frequency division according to the actual requirement and send a calculation result to the frequency division module;

the delay module is configured to, during practical application, provide time delay Δt corresponding to performing time delay operation for a user to select, and notify a selection result of the user to the calculation module; after receiving the calculation result sent by the calculation module, during a period of time corresponding to each low-speed clock period, insert one time delay Δt in a single period of the high-speed clock at intervals of one time interval T until N time delay Δts are inserted, and transmit the high-speed clock which the time delay operation has been performed on to the frequency division module; and the frequency division module is configured to, according to the multiple of frequency division obtained from calculation of the calculation module, perform the frequency division operation on the high-speed clock on which the time delay operation has been performed sent by the delay module to obtain the required low-speed clock.

The present invention is further described in detail combining with the two embodiments hereinafter.

Embodiment 1 in the present embodiment, assuming that the frequency of the high-speed clock is 100 MHz, the frequency of the outputted low-speed clock is 2.00001 MHz, t is the high-speed clock period, and the absolute value of the time delay Δt is selected as t/4.

It can be seen that if the frequency of the low-speed clock is 2 MHz, it is just 50 frequency division from the high-speed clock 100 MHz to the low-speed clock 2 MHz. And in the present embodiment, it increases 10 Hz on the basis of the low-speed clock 2 MHz, so it needs to perform the delay processing on the high-speed clock, and since 2.00001 MHz is 10 Hz greater than the low-speed clock 2 MHz obtained after 50 frequency division is performed on the high-speed clock of 100 MHz, the present embodiment deducts the time delay t/4 in the high-speed clock period, and the specific implementation steps are as follows:

according to the frequency of the high-speed clock 100 MHz and the frequency of the low-speed clock 2.00001 MHz, the time interval T between two adjacent deductions of time delay t/4 in the high-speed clock is calculated to be the total time corresponding to 1000 clock pulses of 2M, and the required total number N of deducting the time delay t/4 is 4; during the period of time corresponding to each low-speed clock period, one time delay t/4 is deducted in the single period of the high-speed clock at intervals of time corresponding to 1000 clock pulses of 2M until four t/4 are deducted; the required low-speed clock of 2.00001 MHz is obtained by performing 50 frequency division on the above-mentioned high-speed clock which the time delay operation has been performed on, that is, deducted by four t/4.

Embodiment 2 in the present embodiment, assuming that the frequency of the high-speed clock as 100 MHz, the frequency of the outputted low-speed clock is 1.99999 MHz, t is the high-speed clock period, and the absolute value of the time delay Δt is selected as t/4.

It can be seen that if the frequency of the low-speed clock is 2 MHz, it is just 50 frequency division from the high-speed clock 100 MHz to the low-speed clock 2 MHz. And in the present embodiment, it decreases 10 Hz on the basis of the low-speed clock 2 MHz, so it needs to perform the delay processing on the high-speed clock, and since 1.99999 MHz is 10 Hz less than the low-speed clock 2 MHz obtained after 50 frequency division is performed on the high-speed clock of 100 MHz, the present embodiment adds the time delay t/4 in the high-speed clock period, and the specific implementation steps are as follows:

according to the frequency of the high-speed clock 100 MHz and the frequency of the low-speed clock 1.99999 MHz, the time interval T between two adjacent additions of time delay t/4 in the high-speed clock is calculated to be the total time corresponding to 1000 clock pulses of 2M, and the required total number N of adding the time delay t/4 is 4; during the period of time corresponding to each low-speed clock period, one time delay t/4 is added in the single period of the high-speed clock at intervals of time corresponding to 1000 clock pulses of 2M until four t/4s are added; the required low-speed clock of 1.99999 MHz is obtained by performing 50 frequency division on the high-speed clock which the time delay operation has been performed on.

Figure 3:
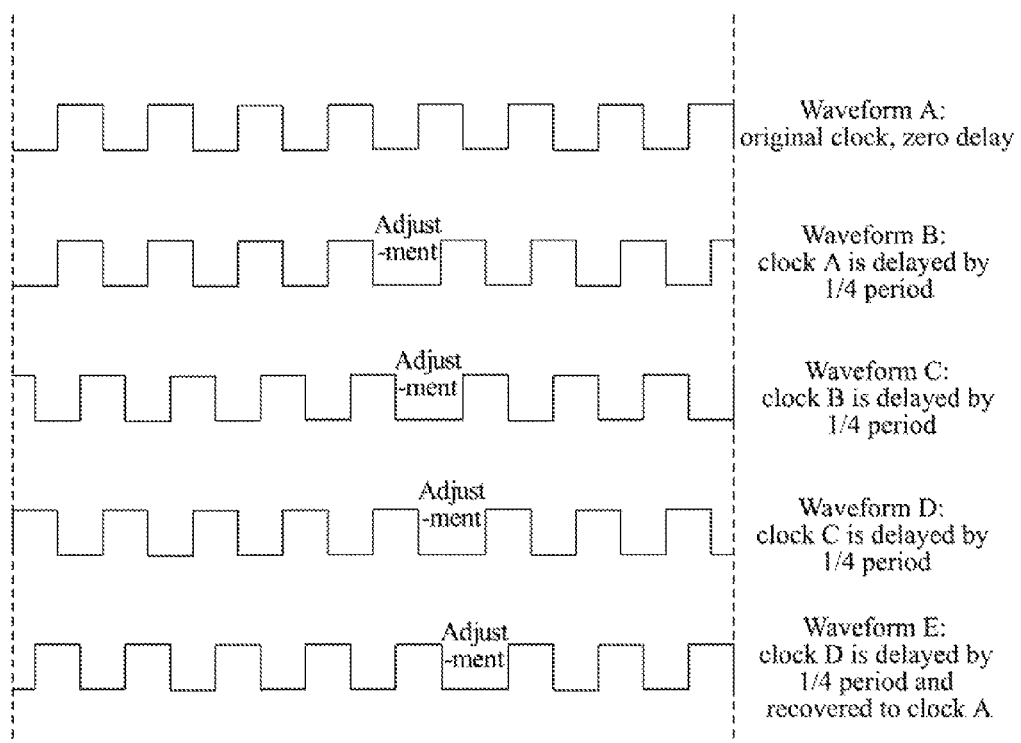
FIG. 3 is an oscillogram of delay adjustment of a high-speed clock according to embodiment 1 of the present invention.
Figure 4:
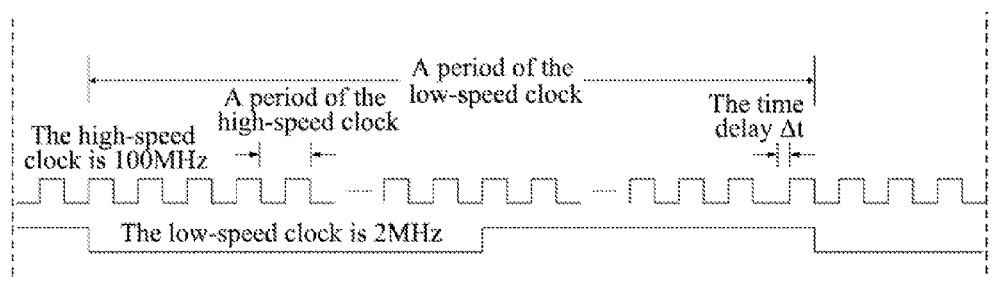
FIG. 4 shows a low-speed clock and inserting a time delay Δt in a single period of a corresponding high-speed clock according to embodiment 1 of the present invention.

FIG. 3 is an oscillogram of delay adjustment of a high-speed clock according to the present embodiment. As shown in FIG. 3, since the initial location of inserting the Δt is random, if the initial waveform of the high-speed clock is A, after adding t/4, that is, the delay t/4, it turns into B waveform; if the initial waveform of the high-speed clock is B, after adding t/4, it turns into C waveform; if the initial waveform of the high-speed clock is C, after adding t/4, it turns into D waveform; if the initial waveform of the high-speed clock is D, after adding t/4, it turns into A waveform. Herein, if regarding A waveform as the initial location of performing the delay, after adding three t/4, then the last t/4 is added to obtain the E waveform, and the waveform turns into the initial location corresponding to A waveform, which is equivalent to deducting three t/4 as well, then after calculation, t/4 is added altogether.

In the above-mentioned two embodiments, if the absolute value of the time delay Δt is supposed to be t/2, it needs to add or deduct t/2 in the single period of the high-speed clock at intervals of time corresponding to 2000 2M clock pulses until adding or deducting 2t/2.

The processing method of the situation in the above-mentioned two embodiments in the related art is: every time when 4000 2 MHz clock pulses are output, deducting or adding one clock pulse of 100 MHz in the single period of the high-speed clock, that is, deducting or adding t.

The current calculation method of deducting or adding one clock pulse of 100 MHz when needing to output 4000 clock pulses of 2 MHz is that: since it is changed by 10 Hz on the basis of the low-speed clock 2 MHz, correspondingly, the high-speed clock should be changed by 2000000/10=200000 low-speed clocks. According to the relation of 50 frequency multiplication between the high-speed clock 100 MHz and the low-speed clock 2 MHz, one clock pulse of 100 MHz is required to be deducted or added in the single period of the high-speed clock at intervals of 200000/50=4000 clock pulses of 2 MHz.

In the present invention, one high-speed clock period t is inserted through N times in the period of time corresponding to the output 4000 clock pulses of 2 MHz, and the inserted time interval each time is t/N, for example: if the absolute value of Δt is supposed to be t/4, t/4 is required to be deducted or added every time when outputting 1000 clock pulses of 2 MHz; if the absolute value of Δt is supposed to be t/2, t/2 is required to be deducted or added every time when outputting 2000 clock pulses of 2 MHz, and finally it adds or deducts t/4 or t/2 altogether. It is obvious that the jitter in the low-speed clock period in the present invention is decreased to ¼ or ½ of the jitter in the low-speed clock period in the current processing method, that is 1/N, and it is obvious that the greater N value is, the smaller generated jitter is.

The above description is only the embodiments of the present invention and is not intended to limit the protection scope of the present invention. All of modifications, equivalent replacement and variations and so on without departing from the spirit and essence of the present invention should be included in the protection scope of the present invention.

The invention claimed is:

1. A method for generating a low jitter low-speed clock, comprising:
   step A: selecting a time delay Δt for delaying the high-speed clock cycles;
   step B: according to the frequency $f_H$ of the high-speed clock cycles, the frequency $f_L$ of the current low-speed clock cycles, the frequency $f_Q$ of the targeted low-speed clock cycles to be obtained after the frequency division is performed, and the time delay Δt got from the step A, calculating the time interval T between two adjacent insertions of the time delay Δt in the high-speed clock cycles, the total number N of the time delay Δts required to be inserted, and times of the multiples of frequency division;
   step C: within each time frame corresponding to a low-speed clock cycle, inserting a time delay Δt in a single period of high-speed clock cycles at the time interval T until number N time delay Δts are inserted;
   step D: according to the times of the multiples of frequency division from the step B, performing the frequency division operation on the high-speed clock cycles from the step C to obtain the low jitter low-speed clock cycles.

2. The method according to claim 1, wherein, the time delay Δt is a positive value or a negative value; and
   said inserting one time delay Δt in the single period of the high-speed clock cycles is: adding or deducting one absolute value of the time delay Δt in the single period of the high-speed clock cycles.

3. The method according to claim 2, wherein, the absolute value of the time delay Δt is less than a value of one high-speed clock period cycles.

4. The method according to claim 2, wherein, said adding or deducting one absolute value of the time delay Δt in the single period of the high-speed clock cycles is based on:
   if a frequency of the low-speed clock cycles required to be obtained is less than a clock frequency obtained after an integer frequency division is performed on the high-speed clock cycles, adding one absolute value of the time delay Δt in the single period of the high-speed clock cycles; and
   if the frequency of the low-speed clock cycles required to be obtained is greater than the clock frequency obtained after the integer frequency division is performed on the high-speed clock cycles, deducting one absolute value of the time delay Δt in the single period of the high-speed clock cycles.

5. An apparatus for generating a low jitter low-speed clock, comprising a clock cycle adjustment module, wherein,
   said clock cycle adjustment module is configured to insert a time delay Δt in each single period of low-speed clock cycles to finely adjust the corresponding high-speed clock cycles, and then perform frequency division operation on the adjusted high-speed clock cycles to obtain the low-jitter low-speed clock cycles;

said clock cycle adjustment module further comprising a delay module, a frequency division module and a calculation module; wherein, said delay module is configured to allow users to select a time delay Δt for delaying the high-speed clock cycles, and notify the selection result to the calculation module; and after receiving the calculation results from the calculation module, within each time frame corresponding to a low-speed clock cycle, insert a time delay Δt in a single period of high-speed clock cycles at the time interval T until number N time delay Δts are inserted, where in the time interval T and the number N are the calculation results from the calculation module; and then said delay module transmit the adjusted high-speed clock cycles to the frequency division module;

said calculation module is configured to, according to the frequency $f_H$ of the high-speed clock cycles, the frequency $f_L$ of the current low-speed clock cycles, the frequency $f_O$ of the targeted low-speed clock cycles to be obtained after the frequency division is performed, and the time delay Δt provided by the delay module, calculate the time interval T between two adjacent insertions of the time delay Δt in the high-speed clock cycles, the total number N of the time delay Δts required to be inserted, and times of the multiples of frequency division; and then send the time interval T and the total number N to the delay module, and send the times of the multiples of frequency division to the frequency division module;

said frequency division module is configured to, according to the times of the multiples of frequency division received from the calculation module, perform the frequency division operation on the high-speed clock cycles that sent from the delay module to obtain the low jitter low-speed clock cycles.

6. The apparatus according to claim 5, wherein, the absolute value of the time delay Δt is less than the value of one high-speed clock cycle period.

7. The method according to claim 1, wherein, the time delay Δt is a positive value or a negative value; and corresponingly, said inserting one time delay Δt in the single period of the high-speed clock cycles is: adding or deducting one absolute value of the time delay Δt in the single period of the high-speed clock cycles.

8. The method according to claim 7, wherein, the absolute value of the time delay Δt is less than a value of one high-speed clock cycles period.

9. The method according to claim 7, wherein, said adding or deducting one absolute value of the time delay Δt in the single period of the high-speed clock cycles is based on:

if a frequency of the low-speed clock cycles required to be obtained is less than a clock cycles frequency obtained after an integer frequency division is performed on the high-speed clock cycles, adding one absolute value of the time delay Δt in the single period of the high-speed clock cycles; and if the frequency of the low-speed clock cycles required to be obtained is greater than the clock frequency obtained after the integer frequency division is performed on the high-speed clock cycles, deducting one absolute value of the time delay Δt in the single period of the high-speed clock cycles.

10. The apparatus according to claim 5, wherein, an absolute value of the time delay Δt is less than a value of one high-speed clock cycle period.

* * * * *